US012627133B2

(12) United States Patent
Koga et al.

(10) Patent No.: US 12,627,133 B2
(45) Date of Patent: May 12, 2026

(54) ARC DETECTION DEVICE, BREAKER, POWER CONDITIONER, SOLAR PANEL, SOLAR-PANEL-ATTACHED MODULE, JUNCTION BOX, ARC DETECTION SYSTEM, AND ARC DETECTION METHOD

(71) Applicant: Panasonic Intellectual Property Management Co., Ltd., Osaka (JP)

(72) Inventors: Tatsuo Koga, Osaka (JP); Keita Kanamori, Osaka (JP); Kazunori Kidera, Osaka (JP); Yoshio Mitsutake, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 186 days.

(21) Appl. No.: 18/272,574

(22) PCT Filed: Feb. 5, 2021

(86) PCT No.: PCT/JP2021/004237
§ 371 (c)(1),
(2) Date: Jul. 15, 2023

(87) PCT Pub. No.: WO2022/168255
PCT Pub. Date: Aug. 11, 2022

(65) Prior Publication Data
US 2024/0072528 A1     Feb. 29, 2024

(51) Int. Cl.
H02H 1/00      (2006.01)
G01R 31/12     (2020.01)
(Continued)

(52) U.S. Cl.
CPC ........... H02H 1/0015 (2013.01); G01R 31/12 (2013.01); H02H 7/20 (2013.01); H02S 50/10 (2014.12)

(58) Field of Classification Search
CPC .... G01R 31/12; G01R 31/1263; G01R 31/14; H02H 1/0015; H02H 7/20; H02H 7/205; H02S 50/10; Y02E 10/50
See application file for complete search history.

(56) References Cited

U.S. PATENT DOCUMENTS

2008/0169824 A1*  7/2008  DeHaven ................. H02H 3/33
                                                              324/555
2011/0019444 A1   1/2011  Dargatz et al.
                          (Continued)

FOREIGN PATENT DOCUMENTS

CN        111211596 A    5/2020
JP        2011-7765 A    1/2011
                 (Continued)

OTHER PUBLICATIONS

International Search Report for corresponding Application No. PCT/JP2021/004237, mailed May 11, 2021.
                 (Continued)

*Primary Examiner* — Judy Nguyen
*Assistant Examiner* — Adam S Clarke
(74) *Attorney, Agent, or Firm* — Renner, Otto, Boisselle & Sklar, LLP

(57) ABSTRACT

An arc detection device that detects an arc fault that occurs in a transmission line connecting a DC power supply that generates DC power and a power converter that converts the DC power to AC power, includes: a first determination unit that determines whether or not there is a possibility of an arc fault occurrence according to current flowing in the transmission line; a shutoff unit that temporarily stops the flow of current in the transmission line when the first determination unit determines there is a possibility of an arc fault occurrence; and a second determination unit that determines whether or not an arc fault has occurred according to an input voltage, of the power converter supplied from the DC
(Continued)

power supply, after lifting temporary stoppage of the flow of current in the transmission line.

11 Claims, 3 Drawing Sheets

(51) Int. Cl.
H02H 7/20 (2006.01)
H02S 50/10 (2014.01)

(56) References Cited

U.S. PATENT DOCUMENTS

| | | | |
|---|---|---|---|
| 2013/0335861 A1 | 12/2013 | Kaschinski et al. | |
| 2018/0233901 A1 | 8/2018 | Ashida et al. | |
| 2019/0296539 A1 | 9/2019 | Kanemaru et al. | |
| 2019/0372522 A1* | 12/2019 | Okita | G01R 31/52 |
| 2020/0014188 A1* | 1/2020 | Koga | G05F 1/67 |

FOREIGN PATENT DOCUMENTS

| | | | |
|---|---|---|---|
| JP | 2013-500476 A | 1/2013 |
| JP | 2014-509396 A | 4/2014 |
| JP | 2016-157364 A | 9/2016 |
| JP | 2017-143667 A | 8/2017 |
| JP | 2018-100877 A | 6/2018 |
| JP | 2018-121434 A | 8/2018 |
| JP | 2021-063663 A | 4/2021 |
| WO | 2011011711 A1 | 1/2011 |
| WO | 2012116722 A1 | 9/2012 |

OTHER PUBLICATIONS

Written Opinion for corresponding Application No. PCT/JP2021/004237, mailed May 11, 2021.

Extended European Search Report for corresponding European Patent Application No. 21924650.1 dated Mar. 20, 1 2024.

Chinese Office Action and Search Report mailed on Sep. 26, 2025, for corresponding Chinese patent application No. 202180082134.0 and English translation of the Search Report.

* cited by examiner

ARC DETECTION DEVICE, BREAKER, POWER CONDITIONER, SOLAR PANEL, SOLAR-PANEL-ATTACHED MODULE, JUNCTION BOX, ARC DETECTION SYSTEM, AND ARC DETECTION METHOD

TECHNICAL FIELD

The present invention relates to an arc detection device and the like for detecting arc faults that occur in a transmission line connecting a DC power supply and a power converter.

BACKGROUND ART

A conventional system is known which converts DC power supplied from a DC power supply such as a photo voltaic (PV) panel (i.e., a solar panel) via a transmission line to AC power using a power conditioner. There have been reports of transmission lines connecting PV panels and power conditioners being damaged or ruptured by external factors or age-related deterioration. Arc faults may occur due to such transmission line damage. In view of this, arc detection means for detecting arc faults have been proposed (for example, see PTL 1). The arc detection means disclosed in PTL 1 attempts to detect arc faults based on fluctuations in the current and voltage applied to the transmission line.

CITATION LIST

Patent Literature

[PTL 1] Japanese Unexamined Patent Application Publication No. 2011-7765

SUMMARY OF INVENTION

Technical Problem

However, the techniques disclosed in PTL 1 may incorrectly detect that an arc fault has occurred even though no arc fault has actually occurred when fluctuation in the current and voltage applied to the transmission line is not due to an arc fault but to disturbance noise, for example.

In view of this, the present invention has an object to provide an arc detection device and the like that can accurately detect arc faults that occur in a transmission line.

Solution to Problem

In order to achieve the above object, in one aspect, an arc detection device according to the present invention detects an arc fault that occurs in a transmission line connecting a DC power supply that generates DC power and a power converter that converts the DC power to AC power, and includes: a first determination unit configured to determine whether or not there is a possibility of an arc fault occurrence according to current flowing in the transmission line; a shutoff unit configured to temporarily stop flow of current in the transmission line when the first determination unit determines there is a possibility of an arc fault occurrence; and a second determination unit configured to determine whether or not an arc fault has occurred according to an input voltage, of the power converter supplied from the DC power supply, after lifting temporary stoppage of the flow of current in the transmission line.

In order to achieve the above object, in one aspect, a breaker according to the present invention includes the arc detection device described above, and interrupts the flow of current in the transmission line when the arc detection device detects that an arc fault has occurred.

In order to achieve the above object, in one aspect, a power conditioner according to the present invention includes the arc detection device and the power converter described above.

In order to achieve the above object, in one aspect, a solar panel according to the present invention is the DC power supply described above and includes the arc detection device described above.

In order to achieve the above object, in one aspect, a solar-panel-attached module according to the present invention includes the arc detection device described above, and converts a signal output from a solar panel, which is the DC power supply described above.

In order to achieve the above object, in one aspect, a junction box according to the present invention includes the arc detection device described above, and connects a solar panel, which is the DC power supply described above, and a power conditioner including the power converter described above.

In order to achieve the above object, in one aspect, an arc detection system according to the present invention includes the arc detection device, the DC power supply, and the power converter described above.

In order to achieve the above object, in one aspect, an arc detection method according to the present invention is a method of detecting an arc fault that occurs in a transmission line connecting a DC power supply that generates DC power and a power converter that converts the DC power to AC power, includes: determining whether or not there is a possibility of an arc fault occurrence according to current flowing in the transmission line; temporarily stopping flow of current in the transmission line when it is determined there is a possibility of an arc fault occurrence; and determining whether or not an arc fault has occurred according to an input voltage, of the power converter supplied from the DC power supply, after lifting temporary stoppage of the flow of current in the transmission line.

Advantageous Effects of Invention

According to one aspect of the present invention, an arc fault that occurs in a transmission line can be accurately detected.

DESCRIPTION OF EMBODIMENTS

The following describes embodiments of the present invention with reference to the drawings. The embodiments described below each show a specific example of the present invention. The numerical values, shapes, materials, elements, the arrangement and connection of the elements, steps, the order of the steps, etc., indicated in the following embodiments are mere examples, and therefore do not intend to limit the present invention.

Note that the respective figures are schematic diagrams and are not necessarily precise illustrations. Additionally, like reference signs indicate like elements. As such, overlapping explanations of like elements are omitted or simplified.

Embodiment 1

The arc detection device and the arc detection system according to Embodiment 1 will be described with reference to the drawings.

Figure 1:
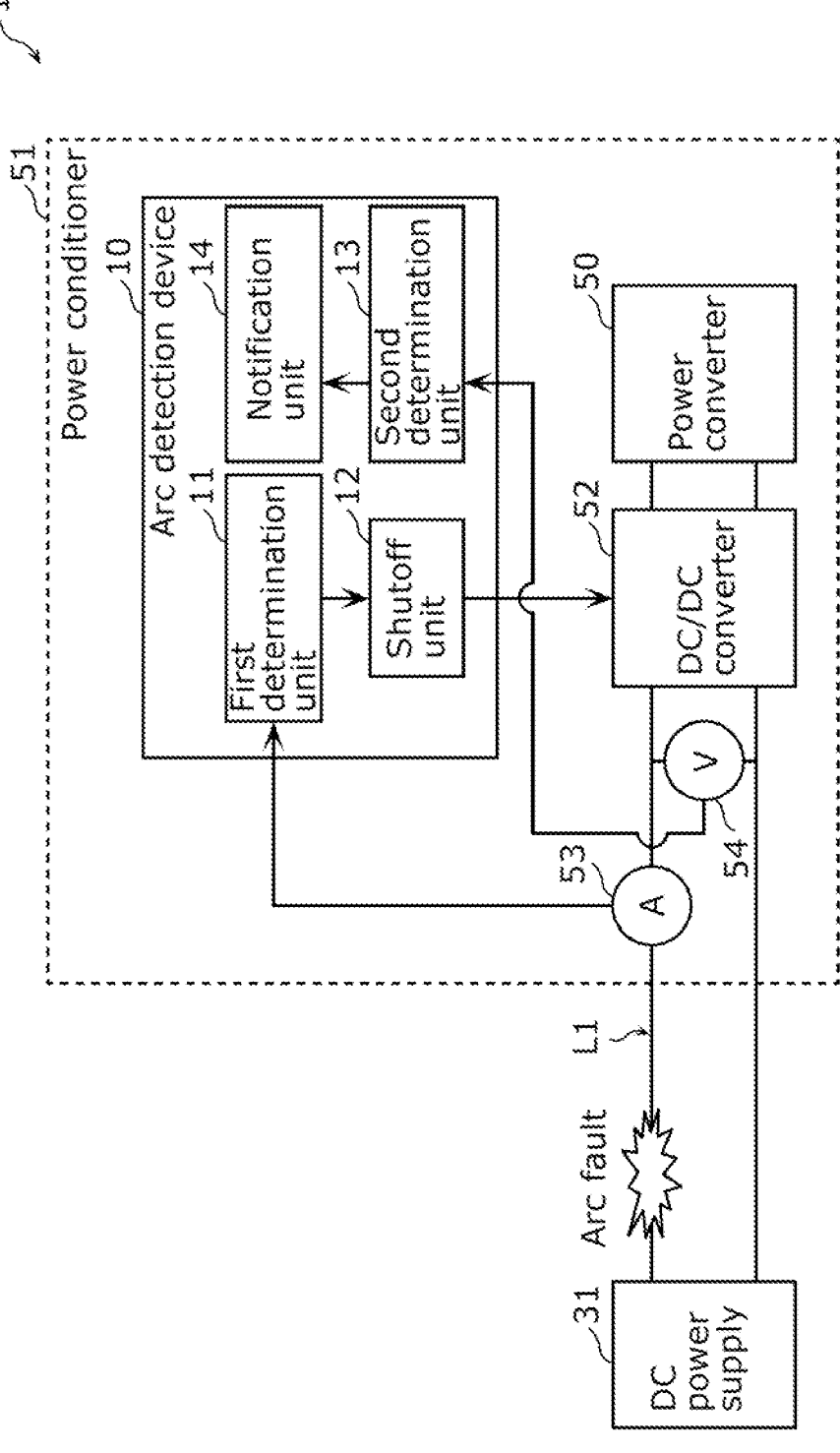
FIG. 1 is a diagram illustrating one example of an arc detection system to which an arc detection device of Embodiment 1 has been applied.

FIG. 1 is a diagram illustrating one example of arc detection system 1 to which arc detection device 10 of Embodiment 1 has been applied.

Arc detection device 10 is applied to arc detection system 1, and includes DC power supply 31, power conditioner 51, and transmission line L1 connecting DC power supply 31 and power conditioner 51 (specifically, power converter 50 included in power conditioner 51, which will be described below). Transmission line L1 consists of a positive transmission line connecting the positive electrode of DC power supply 31 to power converter 50 and a negative transmission line connecting the negative electrode of DC power supply 31 to power converter 50.

DC power supply 31 is a power supply that generates electricity, which is realized, for example, by solar panels. DC power supply 31 may be realized by a rechargeable battery that charges and discharges, or any other power supply that generates DC power.

Power conditioner 51 is a device that converts the DC power generated by DC power supply 31 into AC power. Power conditioner 51 includes arc detection device 10, power converter 50, DC/DC converter 52, current meter 53, and voltmeter 54. The main function of power conditioner 51, which is converting the DC power generated by DC power supply 31 into AC power, is realized by power converter 50. Power converter 50 is, for example, an inverter. Power conditioner 51 uses DC/DC converter 52 to increase or decrease the DC power supplied from DC power supply 31 via power line L1 to a specific voltage, and uses power converter 50 to convert the increased or decreased DC power to AC power. Power conditioner 51, for example, uses the maximum power point tracking (MPPT) method to adjust the current and voltage of the DC power supplied from DC power supply 31 to values that maximize the power. For example, power conditioner 51 converts DC power into AC power with a voltage of 100 V and a frequency of 50 Hz or 60 Hz. For example, AC power is used for household electrical equipment. Current meter 53 measures the current flowing in transmission line L1. The current measured by current meter 53 is normally used to convert DC power to AC power via the MPPT method, but here it is also used to detect arc faults. Voltmeter 54 measures the input voltage of power converter 50, in this case, the input voltage of power converter 50 through DC/DC converter 52. The input voltage of power converter 50 is the voltage between the positive transmission line connecting the positive electrode of DC power supply 31 to power converter 50 and the negative transmission line connecting the negative electrode of DC power supply 31 to power converter 50. The voltage measured by voltmeter 54 is normally used to convert DC power to AC power via the MPPT method, but here it is also used to detect arc faults.

There have been reports of transmission line L1 being damaged or ruptured by external factors and age-related deterioration. Arc faults may occur due to such damage.

Arc detection device 10 detects arc faults that occur in transmission line L1 connecting DC power supply 31 and power converter 50. Arc detection device 10 includes first determination unit 11, shutoff unit 12, second determination unit 13, and notification unit 14 as functional elements for detecting arc faults. Arc detection device 10 is, for example, a microcontroller or a device that includes a microcontroller. A microcontroller is a semiconductor integrated circuit, etc., that includes ROM in which a program is stored, RAM, a processor (a central processing unit (CPU)) that executes the program, a timer, an A/D converter, and a D/A converter. First determination unit 11, shutoff unit 12, second determination unit 13, and notification unit 14 are realized by a processor executing the above program.

First determination unit 11, shutoff unit 12, second determination unit 13, and notification unit 14 will be described with reference to FIG. 2, which describes the operation of arc detection device 10, i.e., the operations of first determination unit 11, shutoff unit 12, second determination unit 13, and notification unit 14.

Figure 2:
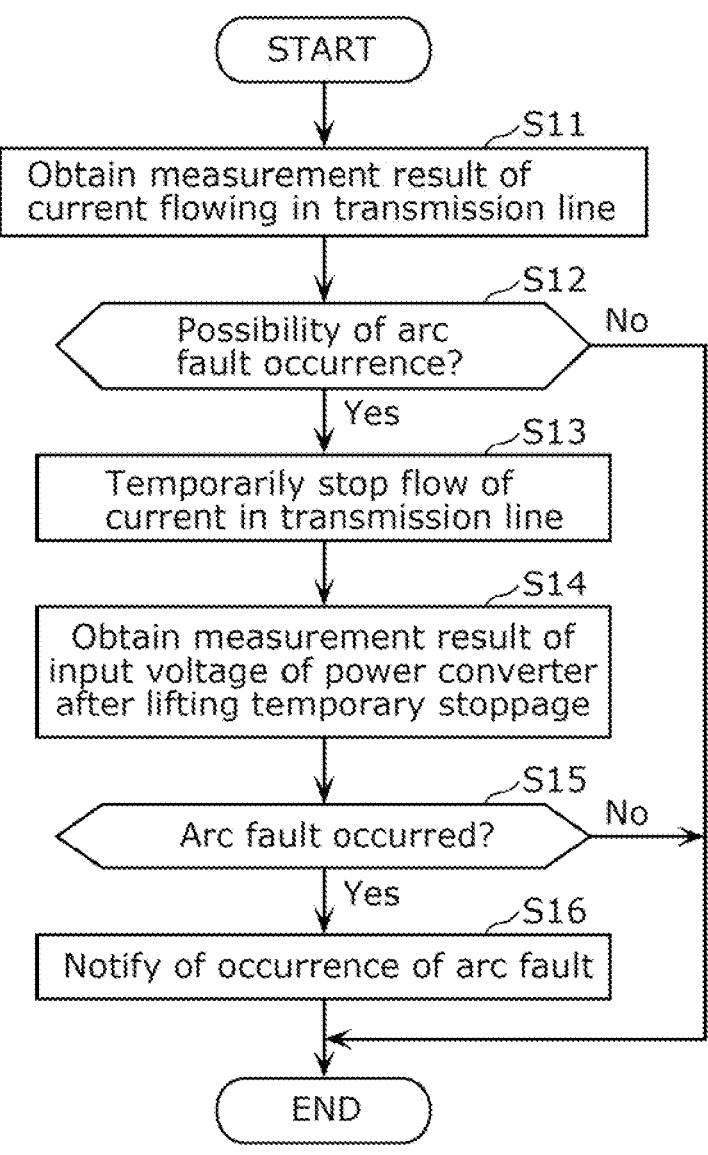
FIG. 2 is a flowchart illustrating one example of an operation of the arc detection device according to Embodiment 1.

FIG. 2 is a flowchart illustrating one example of an operation of arc detection device 10 according to Embodiment 1.

First determination unit 11 obtains a measurement result of the current flowing in transmission line L1 from current meter 53 (step S11).

First determination unit 11 determines whether or not there is a possibility of an arc fault occurrence according to the current flowing in transmission line L1 (step S12). For example, first determination unit 11 performs a frequency analysis of the current flowing in transmission line L1. Frequency analysis involves, for example, calculating the frequency spectrum of the current signal by calculating the Fourier transform of the time waveform of the measurement result of the current. First determination unit 11 determines that there is a possibility of an arc fault occurrence if the current flowing in transmission line L1 contains components in a specific frequency band. The specific frequency band is, for example, the frequency band that includes the frequency at which noise caused by arc faults is generated when an arc fault occurs. The frequency at which noise caused by arc faults is generated can be determined experimentally.

If an arc fault does occur in transmission line L1, the current flowing in transmission line L1 will change, and as described above, it can be determined that there is a possibility of an arc fault occurrence. However, there are other factors that cause the current flowing in transmission line L1 to change in addition to arc faults, such as disturbance noise, so it is necessary to determine whether or not an arc fault has indeed occurred. Since the input voltage of power converter 50 can change when an arc fault occurs due to the disconnection of transmission line L1, one method of determining whether an arc fault has indeed occurred is to measure the input voltage of power converter 50. However, even if an arc fault occurs, current may continue to flow in transmission line L1 due to arc discharge, and the input voltage of power converter 50 may not change significantly, making it difficult to determine whether or not an arc fault has occurred. Therefore, shutoff unit 12 temporarily stops the flow of current in transmission line L1 in order to determine whether or not an arc fault has indeed occurred.

If shutoff unit 12 determines that there is a possibility of an arc fault occurrence (Yes in step S12), it temporarily stops the flow of current in transmission line L1 (step S13). This extinguishes any arc discharge that may have occurred due to the arc fault. If shutoff unit 12 determines that there is no possibility of an arc fault occurrence (No in step S12), the process ends.

For example, shutoff unit 12 temporarily stops the flow of current in transmission line L1 by controlling a switch connected to transmission line L1. The switch connected to transmission line L1 may be a switch directly connected to transmission line L1 or indirectly connected to transmission line L1. For example, the switch is a switch that realizes the DC/DC conversion function in DC/DC converter 52. Even though the switch is not directly connected to transmission line L1, it is indirectly connected to transmission line L1, and thus is considered a switch connected to transmission line L1. For example, shutoff unit 12 temporarily stops the flow of current in transmission line L1 by controlling a switch for realizing the DC/DC conversion function so as to temporarily stop the switching operation of the switch. Then, after a predetermined time (for example, about one second) after stopping the flow of current in transmission line L1, shutoff unit 12 lifts the temporary stoppage of the flow of current in transmission line L1. Stated differently, shutoff unit 12 controls the switch for realizing the DC/DC conversion function so as to turn on the DC/DC conversion function of DC/DC converter 52 (in other words, it tries to flow current through transmission line L1 again). Note that the predetermined time is not limited and may be determined as appropriate.

A switch may be provided in power converter 50 and may turn power converter 50 on and off. For example, shutoff unit 12 controls the switch that turns power converter 50 on and off so as to temporarily turn off power converter 50, thereby temporarily stopping the flow of current in transmission line L1. Then, after a predetermined time after stopping the flow of current in transmission line L1, shutoff unit 12 lifts the temporary stoppage of the flow of current in transmission line L1. Stated differently, shutoff unit 12 controls the switch that turns power converter 50 on and off so as to turn on power converter 50 (in other words, it tries to flow current through transmission line L1 again).

A switch may be provided on transmission line L1 that switches between conduction and non-conduction between DC power supply 31 and DC/DC converter 52 or power converter 50. For example, shutoff unit 12 may temporarily stop the flow of current in transmission line L1 by controlling a switch, which switches between conduction and non-conduction between DC power supply 31 and DC/DC converter 52 or power converter 50, so as to place DC power supply 31 and DC/DC converter 52 or power converter 50 in a non-conducting state. Then, after a predetermined time after stopping the flow of current in transmission line L1, shutoff unit 12 controls the switch, which switches between conduction and non-conduction between DC power supply 31 and DC/DC converter 52 or power converter 50, so as to place DC power supply 31 and DC/DC converter 52 or power converter 50 in a conducting state (in other words, it tries to flow current through transmission line L1 again).

The switch connected to transmission line L1 is, for example, a mechanical switch or a semiconductor switch. Examples of mechanical switches include relays and breakers, and examples of semiconductor switches include transistors and diodes.

Second determination unit 13 obtains, from voltmeter 54, the measurement result of the input voltage, of power converter 50 supplied from DC power supply 31, after lifting the temporary stoppage of the flow of current in transmission line L1 (step S14). For example, second determination unit 13 obtains, from voltmeter 54, the measurement result of the input voltage of power converter 50 supplied from DC power supply 31 upon lifting the temporary stoppage of the flow of current in transmission line L1.

Second determination unit 13 determines whether or not an arc fault has occurred according to the input voltage of power converter 50 after lifting the temporary stoppage of the flow of current in transmission line L1 (step S15). For example, second determination unit 13 determines that an arc fault has occurred when the input voltage after lifting the temporary stoppage of the flow of current in transmission line L1 is less than a predetermined value. The predetermined value is, for example, the input voltage of power converter 50 when power converter 50 is operating normally. If an arc fault has occurred, that means transmission line L1 is disconnected due to the arc fault, so even if the temporary stoppage of the flow of current in transmission line L1 is lifted, no current will flow in transmission line L1, and the input voltage of power converter 50 will become an abnormal value (for example, less than the predetermined value). Stated differently, power converter 50 will be in a state in which it cannot be restarted. If no arc fault has occurred, current will flow through transmission line L1 again and the input voltage of power converter 50 will be a normal value. Power converter 50 can be restarted in this case. In this way, second determination unit 13 can determine whether an arc fault has occurred in transmission line L1.

If notification unit 14 determines that an arc fault has occurred (Yes in step S15), it notifies of the arc fault occurrence (step S16). Notification unit 14 notifies the surrounding area that an arc fault has occurred by, for example, lighting a lamp or sounding a buzzer for informing people that an arc fault has occurred. Notification unit 14 may also notify that an arc fault has occurred by transmitting information indicating such to an information terminal (PC or mobile terminal) of the owner or manager of arc detection system 1. If no arc fault is detected (No in step S15), the process ends. Notification unit 14 may notify that there was a possibility of an arc fault occurrence even if the occurrence of an arc fault is not detected.

As explained above, arc detection device 10 according to the present embodiment detects arc faults that occur in transmission line L1 connecting DC power supply 31, which generates DC power, and power converter 50, which converts the DC power to AC power. Arc detection device 10 includes: first determination unit 11 that determines whether or not there is a possibility of an arc fault occurrence according to current flowing in transmission line L1; shutoff unit 12 that temporarily stops the flow of current in transmission line L1 when first determination unit 11 determines there is a possibility of an arc fault occurrence; and second determination unit 13 that determines whether or not an arc fault has occurred according to an input voltage, of power converter 50 supplied from DC power supply 31, after lifting temporary stoppage of the flow of current in transmission line L1.

If an arc fault does occur in transmission line L1, the current flowing in transmission line L1 will change, whereby it can be determined that there is a possibility of an arc fault occurrence. However, there are other factors that cause the current flowing in transmission line L1 to change in addition to arc faults, such as disturbance noise, so it is necessary to determine whether or not an arc fault has indeed occurred. Since the input voltage of power converter 50 can change when an arc fault occurs due to the disconnection of transmission line L1, one method of determining whether an arc fault has indeed occurred is to measure the input voltage of power converter 50. However, even if an arc fault occurs, current may continue to flow in transmission line L1 due to arc discharge, and the input voltage of power converter 50 may not change significantly, making it difficult to determine whether or not an arc fault has occurred. In view of this, in arc detection device 10 according to this aspect, the flow of current in transmission line L1 is temporarily stopped. This extinguishes any arc discharge that may have occurred due to the arc fault. Then, by lifting the temporary stoppage of the flow of current in transmission line L1, in other words, by trying to flow current through transmission line L1 again, if an arc fault had occurred, no current would flow in transmission line L1 because transmission line L1 would be disconnected due to the arc fault, and the input voltage of power converter 50 would be an abnormal value. If no arc fault had occurred, current would flow through transmission line L1 again and the input voltage of power converter 50 would be a normal value. In this way, arc faults occurring in transmission line L1 can be accurately detected.

Shutoff unit 12 may temporarily stop the flow of current in transmission line L1 by controlling a switch connected to transmission line L1. For example, the switch may be a mechanical switch or a semiconductor switch.

With this, using a switch makes it easy to temporarily stop the flow of current in transmission line L1.

First determination unit 11 may perform a frequency analysis of the current flowing in transmission line L1 and determine there is a possibility of an arc fault occurrence when the current includes a component in a specific frequency band.

With this, when there is a possibility of an arc fault occurrence, the possibility of an arc fault occurrence can be easily determined by frequency analysis of the current flowing in transmission line L1, because noise caused by the arc fault will be generated, in other words, changes will be seen in a specific frequency band corresponding to the noise.

Second determination unit 13 may determine that an arc fault has occurred when the input voltage after lifting temporary stoppage of the flow of current in transmission line L1 is less than a predetermined value.

With this, an arc fault can be determined to have occurred when the input voltage after lifting the temporary stoppage of the flow of current in transmission line L1 is less than a predetermined value, which is, for example, the voltage under normal conditions.

Arc detection device 10 may further include notification unit 14 that notifies of an arc fault occurrence when second determination unit 13 determines that an arc fault has occurred.

With this, it is possible to notify of the arc fault occurrence.

Arc detection system 1 according to the present embodiment includes arc detection device 10, DC power supply 31, and power converter 50.

With this, it is possible to provide arc detection system 1 that can accurately detect arc faults occurring in transmission line L1.

Embodiment 2

In Embodiment 2, an application example of arc detection device 10 will be given.

Figure 3:
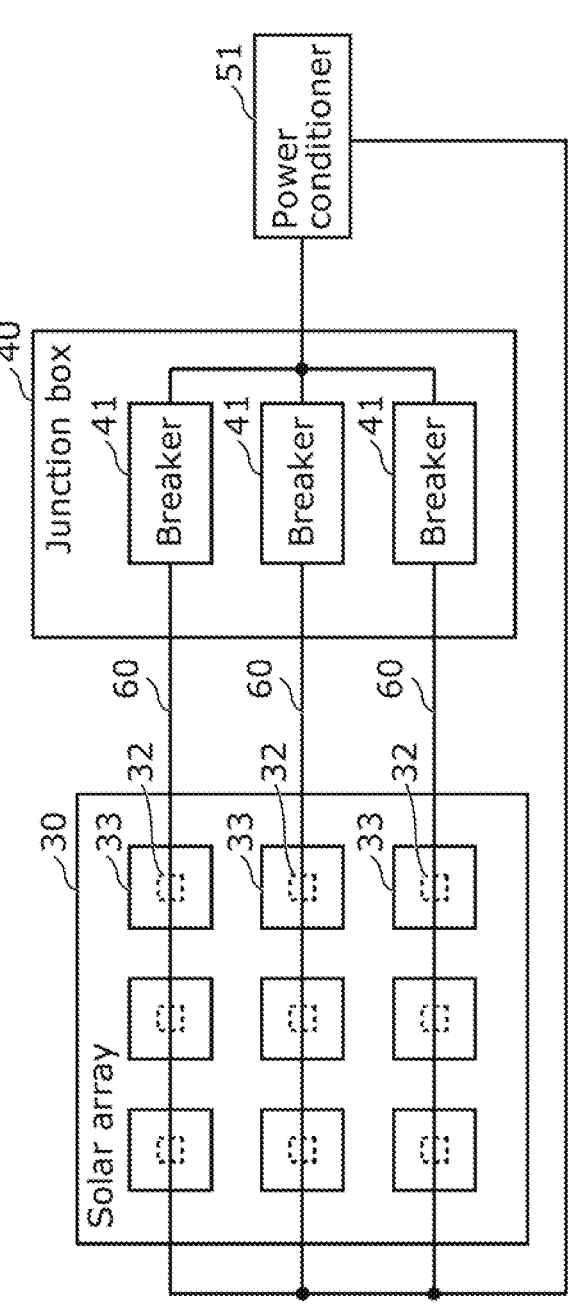
FIG. 3 illustrates an application example of the arc detection device according to Embodiment 1.

FIG. 3 illustrates an application example of arc detection device 10 according to Embodiment 1.

Arc detection device 10 is applied, for example, to a system in which DC power supplied from solar panels 33 via transmission lines is converted to AC power by power conditioner 51. Here, DC power supply 31 in Embodiment 1 corresponds to solar panels 33. In this application example, three sets of three solar panels 33 connected in series by a single string 60 form solar array 30. Strings 60 are grouped together by junction box 40 and connected to power conditioner 51.

For example, a single breaker 41 is provided for each string 60, and in this example, breakers 41 are provided in junction box 40. However, breakers 41 need not be provided in junction box 40. For example, breakers 41 may be provided between junction box 40 and solar array 30, and, alternatively, one breaker 41 may be provided between junction box 40 and power conditioner 51 rather than being provided for each string 60.

Solar panel 33 includes, for example, solar-panel-attached module 32 that converts signals output from solar panel 33. Note that solar panel 33 does not need to include solar-panel-attached module 32. Solar-panel-attached module 32 is, for example, a DC/DC converter that optimizes the amount of power generated per solar panel 33.

In Embodiment 1, power conditioner 51 is described as including arc detection device 10, but power conditioner 51 does not need to include arc detection device 10.

For example, breaker 41 may include arc detection device 10. In such cases, transmission line L1 corresponds to string 60 connected to breaker 41, and each breaker 41 interrupts the flow of current in the connected string 60 when an arc fault is determined to have occurred therein. In this way, the current is not interrupted in strings 60 without arc faults, and these strings 60 can continue to be used.

For example, solar panel 33 or solar-panel-attached module 32 may include arc detection device 10. In such cases, transmission line L1 corresponds to string 60 connected to solar panel 33 and can stop output to string 60 where an arc fault has occurred. For example, if it is determined that an arc fault has occurred, solar panel 33 or solar-panel-attached module 32 will stop output to string 60 where the arc fault occurred. In this way, the output is not stopped for strings 60 where no arc has occurred, and these strings 60 can continue to be used.

For example, junction box 40 may include arc detection device 10. In such cases, transmission line L1 corresponds to string 60 connected to junction box 40, and can interrupt the flow of current in string 60 where an arc fault occurred through, for example, breaker 41. For example, if it is determined that an arc fault has occurred, junction box 40 interrupts the flow of current in string 60 where the arc fault occurred. In this way, the current is not interrupted in strings 60 without arc faults, and these strings 60 can continue to be used.

Arc detection device 10 is not limited to systems in which solar power is generated, and can be applied to any system in which the detection of the occurrence of arc faults is necessary.

Thus, breaker 41 may include arc detection device 10 and may interrupt the flow of current in string 60 when it is determined that an arc fault has occurred. Solar panel 33, which is DC power supply 31, may include arc detection device 10. Solar-panel-attached module 32 may include arc detection device 10 and may convert signals output from solar panel 33. Junction box 40 may include arc detection device 10 and may connect solar panel 33, which is DC power supply 31, to power conditioner 51, which includes power converter 50. As described in Embodiment 1, power conditioner 51 may include arc detection device 10 and power converter 50.

Other Embodiments

Although arc detection device 10 and the like according to embodiments have been described above, the present invention is not limited to these embodiments.

For example, in the above embodiments, arc detection device 10 includes notification unit 14, but arc detection device 10 need not include notification unit 14.

For example, the present invention can be realized not only as arc detection device 10 and the like, but also as an arc detection method that includes steps (processes) performed by elements of arc detection device 10.

More specifically, the arc detection method is a method of detecting arc faults that occur in transmission line L1 connecting DC power supply 31 that generates DC power and power converter 50 that converts the DC power to AC power, and, as illustrated in FIG. 2, includes: a first determining step (step S12) of determining whether or not there is a possibility of an arc fault occurrence according to current flowing in transmission line L1; a stopping step (step S13) of temporarily stopping the flow of current in transmission line L1 when it is determined there is a possibility of an arc fault occurrence (Yes in step S12); and a second determining step (step S15) of determining whether or not an arc fault has occurred according to an input voltage, of power converter 50 supplied from DC power supply 31, after lifting temporary stoppage of the flow of current in transmission line L1.

For example, these steps may be performed by a computer (a computer system). The present invention can be realized as a program for causing the computer to execute the steps included in the method. The present invention can further be realized as a non-transitory computer-readable recording medium, such as a CD-ROM, recorded with the program.

Although arc detection device 10 in the above embodiments is realized as software in a microcontroller, it may also be realized as software in a general-purpose computer such as a personal computer. Furthermore, arc detection device 10 may be realized as hardware via dedicated electronic circuitry of A/D converters, logic circuits, gate arrays, D/A converters, etc.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

The invention claimed is:

1. An arc detection device that detects an arc fault that occurs in a transmission line connecting a DC power supply that generates DC power and a power converter that converts the DC power to AC power, the arc detection device comprising:

a first determination unit configured to determine whether or not there is a possibility of an arc fault occurrence according to current flowing in the transmission line;

a shutoff unit configured to temporarily stop flow of current in the transmission line when the first determination unit determines there is a possibility of an arc fault occurrence; and a second determination unit configured to determine whether or not an arc fault has occurred according to an input voltage, of the power converter supplied from the DC power supply, after lifting temporary stoppage of the flow of current in the transmission line, wherein the first determination unit is configured to perform a frequency analysis of current flowing in the transmission line and determine there is a possibility of an arc fault occurrence when the current includes a component in a specific frequency band, and the second determination unit is configured to determine that an arc fault has occurred when the input voltage after lifting temporary stoppage of the flow of current in the transmission line is less than a predetermined value.

2. The arc detection device according to claim 1, wherein the shutoff unit is configured to temporarily stop the flow of current in the transmission line by controlling a switch connected to the transmission line.

3. The arc detection device according to claim 2, wherein the switch is a mechanical switch or a semiconductor switch.

4. The arc detection device according to claim 1, further comprising:

a notification unit configured to notify of an arc fault occurrence when the second determination unit determines that an arc fault has occurred.

5. A breaker comprising:

the arc detection device according to claim 1, wherein the breaker interrupts the flow of current in the transmission line when the arc detection device detects that an arc fault has occurred.

6. A power conditioner comprising:

the arc detection device according to claim 1; and the power converter.

7. A solar panel comprising:

the arc detection device according to claim 1, wherein the solar panel is the DC power supply.

8. A solar-panel-attached module comprising:

the arc detection device according to claim 1, wherein the solar-panel-attached module converts a signal output from a solar panel which is the DC power supply.

9. A junction box comprising:

the arc detection device according to claim 1, wherein the junction box connects a solar panel which is the DC power supply and a power conditioner including the power converter.

10. An arc detection system comprising:

the arc detection device according to claim 1; the DC power supply; and the power converter.

11. An arc detection method of detecting an arc fault that occurs in a transmission line connecting a DC power supply that generates DC power and a power converter that converts the DC power to AC power, the arc detection method comprising:

determining whether or not there is a possibility of an arc fault occurrence according to current flowing in the transmission line;

temporarily stopping flow of current in the transmission line when it is determined there is a possibility of an arc fault occurrence; and determining whether or not an arc fault has occurred according to an input voltage, of the power converter supplied from the DC power supply, after lifting temporary stoppage of the flow of current in the transmission line, wherein the determining of whether or not there is a possibility of an arc fault occurrence includes performing a frequency analysis of current flowing in the transmission line and determining there is a possibility of an arc fault occurrence when the current includes a component in a specific frequency band, and the determining of whether or not an arc fault has occurred includes determining that an arc fault has occurred when the input voltage after lifting temporary stoppage of the flow of current in the transmission line is less than a predetermined value.

* * * * *